(12) United States Patent
Gresham et al.

(10) Patent No.: US 7,403,065 B1
(45) Date of Patent: Jul. 22, 2008

(54) DIFFERENTIAL TRANSIMPEDANCE AMPLIFIER CIRCUIT FOR CORRELATED DIFFERENTIAL AMPLIFICATION

(75) Inventors: Christopher A. Gresham, Albuquerque, NM (US); M. Bonner Denton, Tucson, AZ (US); Roger P. Sperline, Tucson, AZ (US)

(73) Assignees: Sandia Corporation, Albuquerque, NM (US); Arizona Board of Regents, Tucson, AZ (US)

( * ) Notice: Subject to any disclaimer, the term of this patent is extended or adjusted under 35 U.S.C. 154(b) by 28 days.

(21) Appl. No.: 11/507,838

(22) Filed: Aug. 22, 2006

(51) Int. Cl.
*H03F 1/02* (2006.01)
*H03F 3/08* (2006.01)
(52) U.S. Cl. .......................................... 330/9; 330/308
(58) Field of Classification Search ................ 330/9, 330/51, 69, 253, 59, 308; 327/124; 250/214 A, 250/214 AG
See application file for complete search history.

(56) References Cited

U.S. PATENT DOCUMENTS

| | | | |
|---|---|---|---|
| 4,941,051 A | 7/1990 | Hicks | |
| 5,168,461 A * | 12/1992 | Wu et al. | 708/822 |
| 5,220,286 A * | 6/1993 | Nadeem | 330/51 |
| 5,602,511 A | 2/1997 | Woolaway | |
| 5,844,431 A | 12/1998 | Chen | |
| 5,892,540 A | 4/1999 | Kozlowski et al. | |
| 5,973,536 A * | 10/1999 | Maejima | 330/9 |
| 5,982,232 A | 11/1999 | Rogers | |
| 6,737,924 B1 | 5/2004 | Paillet et al. | |
| 6,809,313 B1 | 10/2004 | Gresham et al. | |
| 6,825,739 B2 | 11/2004 | Fujimoto | |

* cited by examiner

*Primary Examiner*—Khanh V Nguyen
(74) *Attorney, Agent, or Firm*—Carol I. Ashby

(57) ABSTRACT

A differential transimpedance amplifier circuit for correlated differential amplification. The amplifier circuit increase electronic signal-to-noise ratios in charge detection circuits designed for the detection of very small quantities of electrical charge and/or very weak electromagnetic waves. A differential, integrating capacitive transimpedance amplifier integrated circuit comprising capacitor feedback loops performs time-correlated subtraction of noise.

18 Claims, 2 Drawing Sheets

DIFFERENTIAL TRANSIMPEDANCE AMPLIFIER CIRCUIT FOR CORRELATED DIFFERENTIAL AMPLIFICATION

The United States Government has rights in this invention pursuant to Department of Energy Contract No. DE-AC04-94AL85000 with Sandia Corporation.

BACKGROUND OF THE INVENTION

When extremely sensitive detectors are employed, their extreme sensitivity makes them especially sensitive to environmental factors that can produce undesirable electronic noise that can obscure the true signal. Some examples of such environmental factors include interfering electromagnetic waves that are periodic or random (electromagnetic interference or EMI), thermally-induced effects such as, for example, thermally induced current (dark current), circuit and instrumental operating conditions, background radiation, and other random noise sources. When such noise due to environmental factors is present, its amplification can produce a total signal that is dominated by noise contributions rather than by the true signal that one desires to measure (the signal to be measured). To achieve maximum performance, it is highly desirable to remove as much environmentally generated noise as possible before performing the main signal amplification. Differential amplification techniques are helpful for achieving this. In general, differential amplifiers are used to detect small signals in the presence of interfering waveforms and random noise through the process of common mode noise rejection. Whether the interfering electromagnetic waves are periodic or random, the waves can appear simultaneously (within a time dictated by the speed of light and the physical separation of the signal and reference detector elements) at the detector elements. Typically, the charge resulting from an environmental source such as, for example, electromagnetic interference (EMI) is integrated using two independent preamplifiers connected to signal and reference detectors and the amplified signal and reference outputs are applied at the two inputs of a difference amplifier. This leads to amplification of noise as well as of any true signal that may be present.

Detection schemes for detection of ions, electrons, and other charged particles are especially susceptible to such environmental noise problems. For example, ion detectors are required in analytical instrumentation of the types known as ion mobility spectrometers, ion mobility-based explosive and chemical-warfare-agent detectors, and mass spectrometers. Ion mobility-based devices separate ions in a gaseous medium at pressures from approximately 1 Torr to atmospheric pressure. Mass spectrometers have historically required vacuum systems and operate at pressures lower than $10^{-5}$ Torr, although some recent designs operate at substantially higher pressures.

Mass spectrometer detectors are typically one of three types: 1) a single-point ion-neutralization electrode, often of the Faraday-cup type, followed by a current-to-voltage converter (IVC); 2) a single-point ion-to-electron converter followed by an electron multiplier; and 3) an ion-neutralization electrode followed by an integrating charge-to-voltage converter (CVC), which can be assembled into multipoint arrays.

The first two suffer from some inherent limitations. The IVC type suffers from relatively poor ion sensitivity. Intrinsic noise levels are on the order of 6000 ionic charges/s in state-of-the art devices. The electron-multiplier-based detector is susceptible to contamination in poorly evacuated mass spectrometers. Ions must arrive with sufficient kinetic energy to eject an electron from the surface. These ejected electrons are accelerated by a high voltage into the electron multiplier. Both contamination and poor vacuum lead to progressively higher spontaneous noise and lower sensitivity. Electron-multiplier-based detectors will not function at pressures about approximately $10^{-4}$ Torr because the ejected electrons either are slowed by collisions with background gas or react with the background gas.

The CVC-based detector can operate at all pressure and vacuum levels, is relatively immune to contamination of the ion receptor surface, and does not require the ions to arrive at the neutralization electrode with large kinetic energies.

While both IVC-based and CVC-based detectors have been used in ion-mobility-based sensors at pressures up to atmospheric pressure, both types require extensive shielding against electromagnet interference (EMI)-induced noise. What is needed for each is a means to reduce EMI sensitivity and sensitivity to other environmental noise sources while maintaining high sensitivity to analyte ions.

Capacitive transimpedance amplifiers (CTIAs) are suitable for use with CVC-type ion detectors. However, in a standard CTIA, the inputs are very sensitive to induced charge, so they are very susceptible to external electromagnetic wave interference (EMI) and other environmental factors. The most commonly encountered EMI is 60 Hz AC line noise and its second harmonic at 120 Hz. Although the detection limits of ion detectors built using standard CTIA technology are relatively low (comparable to electron multipliers under favorable conditions), even lower detection limits could be obtained if the influence of EMI and other environmental factors could be reduced. Resistance to EMI may be particularly important if such devices are to be used in particularly noisy environments. The differential capacitive transimpedance amplifier approach of this invention addresses this need and provides significant reductions in noise due to EMI and other environmental noise sources.

Differential amplifiers are useful for detecting small signals in the presence of interfering waveforms and random noise though the process of common mode rejection of noise. A differential amplifier or difference amplifier is constructed to produce a signal proportional to the difference in signal between the two inputs and is not sensitive to the absolute difference between the input signals and ground. This absolute difference is common to both inputs and is rejected by the differential amplifier, hence the term "common mode rejection."

A type of CTIA currently used for ion detection in some ion mobility spectrometers is based upon a single-output differential amplifier circuit. It typically consists of a detector such as a Faraday cup connected to the inverting input of an operational amplifier (op amp). A capacitor is connected between the inverting input and the output of the op amp. A charge builds up on the input side of the capacitor that is proportional to the charge received by the Faraday cup. Charge that is induced by environmental factors on the input side also contributes to the charge that builds up on the capacitor, producing an undesirable noise contribution to the measured charge.

Gresham et al. (U.S. Pat. No. 6,809,313) describes a plurality of capacitive transimpedance amplifiers (CTIAs) adjacent to a collecting surface that are electrically connected to a plurality of conductive elements so that charge from an ion striking an element is transferred to the capacitor of the connected CTIA. A controller counts the charge on the capacitors over a period of time.

BRIEF DESCRIPTION OF THE DRAWINGS

The accompanying drawings, which are incorporated in and form part of the specification, illustrate some embodiments of the present invention and, together with the description, serve to explain the principles of the invention.

DETAILED DESCRIPTION OF THE INVENTION

Several problems can occur when using typical differential amplification techniques. With such techniques, internal amplifier noise is uncorrelated, amplifier noise from the preamplifiers connected to the signal and reference detectors can add, and clipping can occur when noise signals are high. To overcome these and other common differential amplification problems, one can use the correlated differential amplification approach of this invention. The embodiments of the invention described herein display differential charge-to-voltage (CTV) conversion amplification with the following characteristics. Embodiments of this invention use time-correlated differential operation to minimize noise due to EMI and to provide for effective subtraction of time-correlated noise arising from external environmental sources and from the internal operation of the CVC or other parts of a detection system. True correlated noise subtraction is achieved using a differential output amplifier before a high-gain amplifier. Correlated noise is subtracted at an early stage of charge detection before passing the signal to a high-gain amplifier. This prevents noise from driving the high-gain amplifier to its compliance limits. Embodiments of this invention comprise a fully differential capacitive transimpedance amplifier (diffCTIA) circuit with a feedback capacitor system. The embodiments of this invention enable subtraction of the charge arriving at the signal and reference input channels at a high-input-impedance stage. This enables removal of input noise prior to amplification of the difference signal in a low-impedance amplification stage or stages. Embodiments of this invention are applicable to the sensitive detection of electrons or of either positively or negatively charged ions when it is advantageous to have very high sensitivity with low noise levels. Examples of applications include but are not restricted to ion-mobility instruments, differential mobility analysis instruments, mass spectrometer instruments, aerosol particle analysis instruments, and others known to those of skill in the art.

Embodiments of this invention are also applicable to the sensitive detection of electronic charges arising from interaction of photons with photodiodes, phototransistors, light detection arrays such as, for example, CMOS light-detection arrays, and other type of photodetectors known to those of skill in the art.

Figure 1:
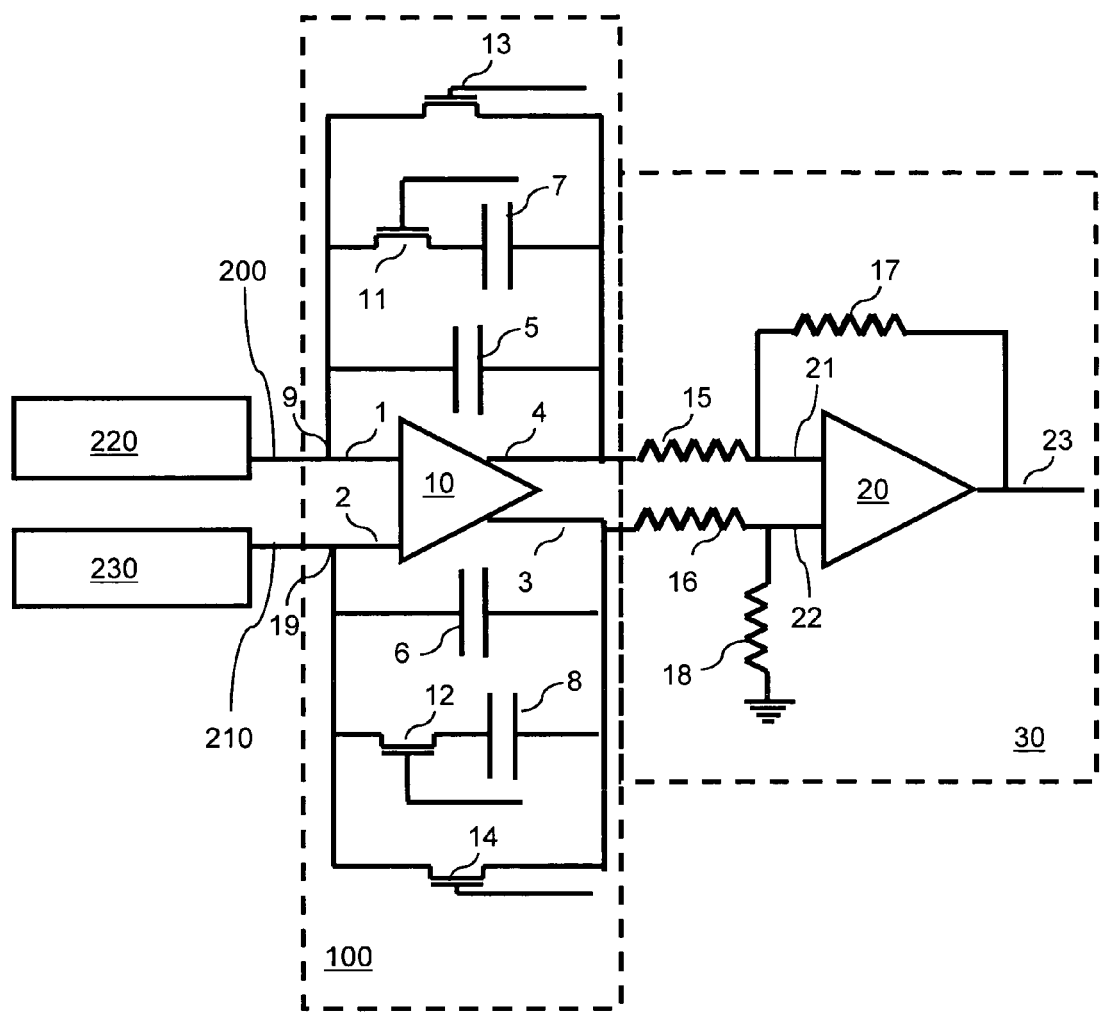
FIG. 1 illustrates an embodiment of the differential capacitive transimpedance amplifier circuit in which the output from a differential output operational amplifier is input to an operational amplifier subtraction subcircuit.
Figure 2:
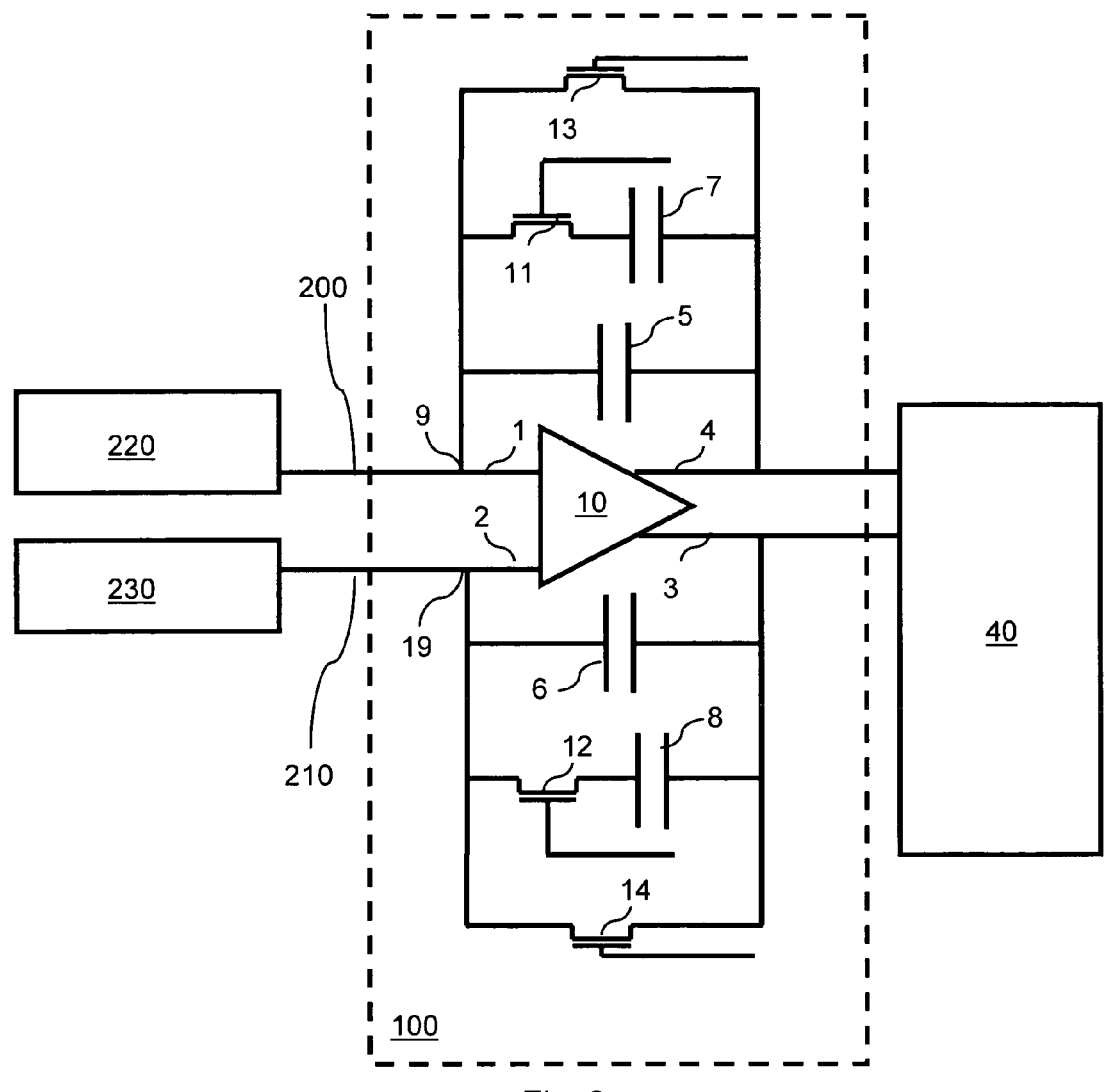
FIG. 2 illustrates an embodiment of the differential capacitive transimpedance amplifier circuit in which the output from a differential output operational amplifier is input to a switch means.

FIG. 1 illustrates one embodiment of the differential capacitive transimpedance amplifier (diffCTIA) 100. It comprises a differential output amplifier 10 having two charge-sensing inputs, the inverting input 1 and the non-inverting input 2, and two outputs, the inverting output 3 and the non-inverting output 4. Each input has its own capacitive feedback loop comprising at least one capacitor 5 and 6. To provide variable gain, the feedback loop can optionally comprise one or more additional gain-controlling capacitors 7 or 8 connected in parallel with the first capacitor 5 or 6. Gain-controlling switch means 11 and 12 are used to control the inclusion of the gain-controlling capacitors of the gain-control feedback loops in the circuit. A field-effect transistor (FET) can be used for these switch means; other switch types can also be employed, including but not restricted to mechanical switches, relays, bipolar transistors, insulated gate bipolar transistors, and junction field-effect transistors (JFETs). Reset switch means 13 and 14 are used to control the time during which charge is permitted to accumulate on the capacitors of the feedback loops. In some embodiments, these are normally-open switches that are closed following an integration time to reset the circuit for the next charge measurement. A field-effect transistor (FET) can be used for these switch means; other switch types can also be employed, including but not restricted to mechanical switches, relays, bipolar transistors, insulated gate bipolar transistors, and junction field-effect transistors (JFETs). An output voltage proportional to the time integral of the difference in the charge applied to the inverting 1 and non-inverting 2 inputs of the amplifier 10 is produced at the inverting 3 and non-inverting 4 outputs. For an input signal A 200 from a detection element 220 connected through the first input node 9 to the inverting input 1 and an input signal B 210 from a detection element connected through the second input node 19 to the non-inverting input 2, outputs of (B−A) and (A−B) are provided at the non-inverting output 4 and inverting output 3, respectively. In various embodiments, the detection element may be a single detector or an element of an array detector.

For differential output amplifier 10 to most effectively subtract time-correlated noise arriving at the two inputs with little complication due to uncorrelated noise, in many embodiments it should have as few as possible circuit elements that can contribute uncorrelated noise between the input terminals and the point of subtraction in the circuit. Large value resistors, active semiconductor devices such as transistors, and long conductors can either create uncorrelated electrical noise or receive uncorrelated environmental electrical noise, so the interposition of them between the input terminal and the subtraction point should be minimized. The extent to which the uncorrelated noise affects the final signal depends on the desired sensitivity of the circuit. For example, if the intent is to detect signals corresponding to approximately 100 electrons of charge, the un-correlated noise at the subtraction point should, in general, not exceed approximately 30 electrons of charge, measured in the root-mean-square fashion. In such a case, it would be desirable that only one active semiconductor amplifier device should be interposed between each input terminal and the subtraction point. In addition, it is desirable that circuit elements interposed between the input terminal and the subtraction point should be located close to each other to minimize the time-lag between their responses to electromagnetic waves arising either environmentally or from other components in the circuit. Similar considerations apply to the feedback capacitors, the reset switches, the gain-control capacitors and switches, and the interconnections between them and differential amplifier 10. In some embodiments, this is achieved by forming the components as parts of a solid state integrated circuit device. In many embodiments, improved operation can be achieved by including the differential output amplifier 10, the capacitors 3 and 5, and optionally variable gain capacitors, such as, for example, 7 and 8 in an integrated circuit device to minimize contributions due to uncorrelated noise. In some embodiments, other circuit elements, such as, for example, gain-control switches and reset switches can be included in the integrated circuit device.

The detection elements 220 and 230 are charge transduction devices, that is, they receive a signal and provide a corresponding electrical signal. Examples include but are not restricted to devices that directly receive a charged particle to produce an electrical signal, such as, for example. Faraday cups, devices that receive a photon to produce an electrical signal, such as, for example, photodetectors, and antennae that intercept electromagnetic waves to produce an electrical signal.

In some embodiments, the outputs 3 and 4 of the diffCTIA 100 are input to a single-output differential amplifier subcircuit 30. In the embodiment illustrated in FIG. 1, output 4 is connected through resistor 15 to the amplification inverting input 21 of differential amplifier 20 and output 3 is connected to the amplification non-inverting input 22. The amplification output voltage at 23 is a voltage that is the product of the amplifier gain and times two times the difference between the initial signal A 200 and the correlated signal B 210, that is, $E_{out}=gain \times 2(A-B)$, where the gain is determined by the values of the resistors 15, 16, 17, and 18. In this embodiment, the values of resistors 15, 16, 17, and 18 can be approximately the same, leading to $E_{out}=gain \times 2(A-B)$. For the desired subtraction A−B, the ratio of the resistance of 15 to the resistance of 17 will be approximately equal to the ratio of the resistance of 16 to the resistance of 18. In operation, the difference in voltage between the two outputs is caused to be proportional to the difference in charge applied to the two inputs.

In some embodiments, only the output voltage on 4 or only the output voltage on 3 will be further amplified by a secondary amplifier subcircuit.

In some embodiments, a signal detector element generates signal A and a noise detector element generates signal B. Alternatively, the signal detector element can generate signal B and the noise detector element can generate signal A. Switching the connections changes the sign of the output signal.

In some embodiments, the outputs 3 and 4 of the diffCTIA 100 are input to an output switch means. One example of a switch means is a multiplexer 40. In an example of such an embodiment, an array of detector element pairs is connected to an array of diffCTIAs and the array of diffCTIAs is connected to a multiplexer to allow selective determination of the charges striking a particular pair of detector elements.

In some embodiments, either only output 3 or only output 4 is connected to an output switch means.

An example of an embodiment using a multiplexer switch means employs an array of diffCTIAs. In one embodiment, the selected feedback capacitances for amplifier 10 are changed from 10 femtoFarads to 1000 femtoFarads by closing switches 11 and 12 to connect 990 femtoFarad capacitors 7 and 8 in parallel with 10 femtoFarad capacitors 5 and 6. Additional feedback capacitors and associated switches connected in parallel can be used to provide additional gain (transimpedance) ranges. Other capacitance values can be used depending on the desired sensitivity and dynamic range. Closing the reset switches 13 and 14 discharges the parallel capacitors and prepares the diffCTIA for the next charge-accumulation cycle. A field-effect transistor (FET) can be used for these switch means; other switch types can also be employed, including but not restricted to mechanical switches, relays, bipolar transistors, insulated gate bipolar transistors, and junction field-effect transistors (JFETs).

In some embodiments, a "sample and hold" feature could be added between the detector elements 220 and 230 and the inputs of amplifier 10, in the form of an FET switch or other switch means to disconnect elements 220 and 230 after some period of time. This switch means would enable repeated measurements of the output voltage while the input signal was, in effect, constant. This method of operation would introduce the random noise called "kT over C noise" when the switch means was opened. Similar noise may be associated with reset switches 13 and 14, and the gain-controlling switches 11 and 12. If the signal is small, the kT over C noise may set the lower limit of the signal-to-noise ratio. In such cases, the kT over C noise can be removed by the technique known as "correlated double sampling." A FET could be used for this switch; other switch types can also be employed including but not limited to mechanical switches, relays, bipolar transistors, insulated gate bipolar transistors, and JFET transistors.

Much less electromagnetic shielding is required to optimize the signal-to-noise ratio of the diffCTIA than is required to achieve the same signal-to-noise ratio for a non-differential CTIA. Use of the diffCITA enables reduction of both the size and weight of EMI shielding.

An example of an application of the diffCTIA can have two input detection elements (detectors), one directly in the path of the charges to be detected (signal input) and one as close as possible to that path but unable to receive any of the signal charges (reference input). For optimum signal-to-noise, the orientation of the detection elements should be selected so that both detection elements are subjected equally to any environmentally generated noise or instrumentally generated waveforms or noise. It is generally desirable whenever possible that the detection elements should be positioned to receive the EMI with the same amplitude at each element, especially when environmental EMI is an important noise source. If it is not possible to place the reference element at a location where it receives the EMI noise wavefronts simultaneously with the signal element, an appreciable reduction in EMI noise can still be obtained. There will be nearly total rejection of longer wavelength EMI noise, while high-frequency component of the EMI noise can be minimized by designing gain roll-off in the amplifier circuitry, as is well know to those skilled in the art.

An example of an application of an embodiment of this invention is described below. A fabricated diffCTIA was used in a miniature ion mobility spectrometer to demonstrate the noise reduction capabilities of the differential circuit. The charge neutralization electrode corresponding to the ion signal was 3 mm in diameter and placed on the axis of the spectrometer drift cell, to receive the maximum number of analyte ions. A reference electrode 3 mm in diameter was placed coplanar with the signal electrode, but centered 7 mm off the drift tube axis. This electrode received no or very few ions. The two electrodes were connected to the two inputs of a diffCTIA with 10 femtoFarad capacitors in the two feedback loops. The two output voltages, representing ((signal charges+noise))−(reference charges+noise)) and ((reference charges+noise)−(signal charges+noise)) from the diffCTIA were transmitted to a two channel analog-to-digital converter through two non-inverting buffer amplifiers. These two digitized voltages were subtracted in software. The entire ion mobility spectrometer and diffCTIA circuit was placed in a 5"×5" cast aluminum box 2" deep with a removable 5"×5" cast aluminum cover.

For a performance comparison, a non-differential CITA detector circuit with a 10 femtoFarad feedback capacitor was connected to an ion mobility spectrometer that was nearly identical to that described above and placed in a nearly identical aluminum box. This detector had the inverted voltage output created by an inverting operational amplifier connected to the signal output. Following analog-to-digital conversion by the same apparatus as in the diffCTIA case, the signal voltage and the inverted signal voltage values were subtracted in software.

In each case, the transimpedance of the example device was 15.8 microVolts per electron. The primary amplifier integrated circuits were not capable of providing significant current to the rest of the detector circuits when a measurement was attempted, so secondary amplifiers were used to provide a significant current to the measurement circuit and thus protect the primary CTIA amplifiers from voltage distortions caused by excess current. The secondary amplifiers had "high current gain" in the sense that the ratio of output current capability to input current requirement is a large number. This property represented a large decrease in "impedance". In addition, the output amplifiers were capable of producing an output voltage that was much larger than those produced by the primary amplifiers. In this sense, the secondary amplifiers also had "high voltage gain".

In the example device, the secondary amplifiers had voltage gain of 1.0 and were capable of an undistorted output into 50 Ohms. Assuming the primary amplifiers received a current of 1 electron per second, the output current of each of the secondary amplifiers was $2 \times 10^{12}$ electrons per second after one second. This demonstrated the large current gain obtained.

The effect of environmental noise on the non-differential CTIA ion mobility data was to increase the baseline noise by 2000%, from 0.0025 V(RMS) to 0.050 V (RMS) when the lid was removed from the box. In the case of the differential CTIA, removal of the box lid resulted in a baseline noise increase from 0.002 V(RMS) to 0.0025V(RMS), an increase of only 25%. The majority of the noise observed in the non-differential CTIA apparatus when the lid was removed was at 120 Hz. When both devices were well shielded by the cast aluminum boxes with appropriate lids and powered with very carefully filtered power sources, the two types of CTIA had equivalent noise levels.

In some embodiments, the outputs 3 and 4 are connected optionally through a switching means to one or more analog-to-digital converters and the subtraction is performed digitally.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A capacitive differential transimpedance amplifier circuit, comprising:
    a differential output amplifier, the differential output amplifier having a pair of inputs and a pair of outputs, the pair of inputs comprising a first inverting input and a first non-inverting input, and the pair of outputs comprising a first inverting output and a first non-inverting output;
    a pair of detection elements;
    a first input node, the first input node being connected to the first inverting input, wherein a first input signal from a first detection element of the pair of detection elements is direct-current-coupled through the first input node to the first inverting input;
    a second input node, the second input node being connected to the first non-inverting input, wherein a second input signal from a second detection element of the pair of detection elements is direct-current-coupled through the second input node to the first non-inverting input;
    an inverting-input feedback capacitor connected between the first inverting input and the first non-inverting output;
    a non-inverting-input feedback capacitor connected between the first non-inverting input and the first inverting output;
    an inverting-input reset switch means connected in parallel with the inverting-input feedback capacitor between the first inverting input and the first non-inverting output; and
    a non-inverting-input reset switch means connected in parallel with the non-inverting-input feedback capacitor between the first non-inverting input and the first inverting output.

2. The capacitive differential transimpedance amplifier circuit of claim 1, further comprising
    a pair of gain-control feedback loops, each gain-control feedback loop comprising a gain-controlling capacitor and a gain-controlling switch means, each gain-control feedback loop being connected in parallel with one of the non-inverting-input feedback capacitor and the inverting-input feedback capacitor.

3. The capacitive differential transimpedance amplifier circuit of claim 1, further comprising:
    a differential amplifier subcircuit comprising a differential amplifier having a pair of amplifier inputs comprising an amplification inverting input and an amplification non-inverting input, wherein the first non-inverting output is operably connected to the amplification inverting input and the first inverting output is operably connected to the amplification non-inverting input; and
    an amplification feedback element connected between the amplification inverting input and an amplification output.

4. The capacitive differential transimpedance amplifier circuit of claim 3, wherein the amplification feedback element comprises a resistor.

5. The capacitive differential transimpedance amplifier circuit of claim 3, further comprising an inverting-input resistive element connected between the first non-inverting output and the amplification inverting input and a non-inverting-input resistive element connected between the first inverting output and the amplification non-inverting input.

6. The capacitive differential transimpedance amplifier circuit of claim 1, further comprising:
    a differential amplifier subcircuit comprising a differential amplifier having a pair of amplifier inputs comprising an amplification inverting input and an amplification non-inverting input, wherein the first non-inverting output is operably connected to the amplification non-inverting input and the first inverting output is operably connected to the amplification inverting input; and
    an amplification feedback element connected between the amplification inverting input and an amplification output.

7. The capacitive differential transimpedance amplifier circuit of claim 1, further comprising an amplifier subcircuit comprising an amplifier operably connected to one of the first inverting output and the first non-inverting output.

8. The capacitive differential transimpedance amplifier circuit of claim 1, further comprising:
two amplifier subcircuits wherein
a first amplifier subcircuit of the two amplifier subcircuits comprising an amplifier operably connected to the first inverting output, and
a second amplifier subcircuit of the two amplifier subcircuits comprising an amplifier operably connected to the first non-inverting output.

9. The capacitive differential transimpedance amplifier circuit of claim 1, wherein the first detection element and the second detection element are electrical charge detection elements.

10. The capacitive differential transimpedance amplifier circuit of claim 9, wherein a first one of a pair consisting of the first detection element and the second detection element is positioned to provide current resulting from a signal to be measured and current generated by environmental factors and wherein a second one of the pair consisting of the first detection element and the second detection element is positioned to provide current generated by environmental factors only.

11. The capacitive differential transimpedance amplifier circuit of claim 9, wherein the first detection element and the second detection element are charge transduction devices.

12. The capacitive differential transimpedance amplifier circuit of claim 11, wherein the charge transduction devices are Faraday cups, photodetectors, or antennae.

13. The capacitive differential transimpedance amplifier circuit of claim 1, wherein at least one of the first inverting output and the first non-inverting output is operably connected to an output switch means.

14. The capacitive differential transimpedance amplifier circuit of claim 13, wherein the output switch means comprises a multiplexer.

15. The capacitive differential transimpedance amplifier circuit of claim 13, wherein the output switch means is selected from a mechanical switch, a relay, a bipolar transistor, an insulated-gate bipolar transistor, a field-effect transistor, and a junction field-effect transistor.

16. The capacitive differential transimpedance amplifier circuit of claim 1, wherein the inverting-input reset switch means and the non-inverting-input reset switch means are selected from a mechanical switch, a bipolar transistor, an insulated-gate bipolar transistor, a field-effect transistor, and a junction field-effect transistor.

17. The capacitive differential transimpedance amplifier circuit of claim 1, wherein a solid-state integrated circuit device comprises the differential output amplifier, the inverting-input feedback capacitor, and the non-inverting-input feedback capacitor.

18. The capacitive differential transimpedance amplifier circuit of claim 17, wherein the solid-state integrated circuit device further comprises a pair of gain-control feedback loops, each gain-control feedback loop comprising a gain-controlling capacitor and a gain-controlling switch means, each gain-control feedback loop being connected in parallel with one of the non-inverting-input feedback capacitor and the inverting-input feedback capacitor.

* * * * *